United States Patent
Qi et al.

(10) Patent No.: US 9,627,089 B2
(45) Date of Patent: Apr. 18, 2017

(54) SHIFT REGISTER, GATE DRIVING CIRCUIT, AND DISPLAY DEVICE

(71) Applicants: BOE TECHNOLOGY GROUP CO., LTD., Beijing (CN); Chengdu BOE Optoelectronics Technology Co., Ltd., Chengdu, Sichuan Province (CN)

(72) Inventors: Xiaojing Qi, Beijing (CN); Bo Wu, Beijing (CN)

(73) Assignees: BOE TECHNOLOGY GROUP CO., LTD., Beijing (CN); CHENGDU BOE OPTOELECTRONICS TECHNOLOGY CO., LTD., Chengdu, Sichuan Province (CN)

( * ) Notice: Subject to any disclaimer, the term of this patent is extended or adjusted under 35 U.S.C. 154(b) by 128 days.

(21) Appl. No.: 14/448,076

(22) Filed: Jul. 31, 2014

(65) Prior Publication Data

US 2015/0302934 A1 Oct. 22, 2015

(30) Foreign Application Priority Data

Apr. 18, 2014 (CN) .......................... 2014 1 0158842

(51) Int. Cl.
*G11C 19/00* (2006.01)
*G11C 19/18* (2006.01)
*G11C 19/28* (2006.01)

(52) U.S. Cl.
CPC ............ *G11C 19/184* (2013.01); *G11C 19/28* (2013.01); *G09G 2310/0286* (2013.01)

(58) Field of Classification Search
None
See application file for complete search history.

(56) References Cited

U.S. PATENT DOCUMENTS

| 4,623,908 | A | * | 11/1986 | Oshima | G02F 1/1368 257/66 |
|---|---|---|---|---|---|
| 8,175,215 | B2 | * | 5/2012 | Liu | G11C 19/28 377/64 |
| 8,330,702 | B2 | * | 12/2012 | Miyake | G09G 3/3677 345/100 |
| 8,422,621 | B2 | * | 4/2013 | Jang | G09G 3/3677 377/64 |
| 2008/0012818 | A1 | * | 1/2008 | Lee | G09G 3/3677 345/100 |

(Continued)

*Primary Examiner* — Tuan T Lam
(74) *Attorney, Agent, or Firm* — Nath, Goldberg & Meyer; Joshua B. Goldberg

(57) ABSTRACT

The present invention provides a shift register, a gate driving circuit and a display device. The shift register comprises a precharge and reset module, a pull-up module, a pull-down module and a cut-off module, the cut-off module, the pull-up module and the pull-down module are connected at a first node, and the cut-off module is connected between the first node and the precharge and reset module. In the present invention, the cut-off module is provided to disconnect electric connection between the precharge and reset module and the pull-up module, such that the first node cannot discharge through the precharge and reset module, which effectively avoids internal discharge of the shift register, and further ensures normal output of the signal output from the output terminal of the shift register, and improves stability of the shift register.

19 Claims, 8 Drawing Sheets

(56) References Cited

U.S. PATENT DOCUMENTS

| | | | |
|---|---|---|---|
| 2010/0201659 A1* | 8/2010 | Miyake | G09G 3/3677 345/205 |
| 2011/0116592 A1* | 5/2011 | Tsai | G11C 19/184 377/79 |
| 2012/0139599 A1* | 6/2012 | Chen | G09G 3/3677 327/203 |
| 2014/0023173 A1* | 1/2014 | Miyake | G11C 19/188 377/54 |
| 2015/0043703 A1* | 2/2015 | Tan | G11C 19/28 377/68 |
| 2015/0187433 A1* | 7/2015 | Zheng | G09G 3/20 345/207 |
| 2015/0318052 A1* | 11/2015 | Li | G11C 19/28 377/64 |

\* cited by examiner

SHIFT REGISTER, GATE DRIVING CIRCUIT, AND DISPLAY DEVICE

FIELD OF THE INVENTION

The present invention relates to the field of display technology, and in particular to a shift register, a gate driving circuit, and a display device.

BACKGROUND OF THE INVENTION

With the development of flat panel display technology, a display device with high resolution and narrow bezel has become the trend of development, and integrating a gate driving circuit on a display panel is an important solution to realize the display device with high resolution and narrow bezel.

FIG. 1 is a circuit diagram of a shift register in the prior art, and FIG. 2 is a timing diagram of signals of the shift register shown in FIG. 1. As shown in FIG. 1, the shift register comprises: a precharge transistor T100, a reset transistor T200, a pull-up transistor T300, a pull-down transistor T400 and a bootstrap capacitor C100, wherein a connection point where the bootstrap capacitor C100 and the pull-up transistor T300 are connected is a first node PU1, a start signal STV is input via a start signal input terminal connected to a gate of the precharge transistor T100, a reset signal RESET is input via a reset signal input terminal connected to a gate of the reset transistor T200, a output signal OUTPUT is output via a output terminal of the shift register, VGH represents a high-level voltage, and VGL represents a low-level voltage.

A thin film transistor (TFT) made of a-si (amorphous silicon) or p-si (polycrystalline silicon) is an enhancement-mode TFT. When the enhancement-mode TFTs are applied in the above shift register circuit, the shift register shown in FIG. 1 can operate normally (as indicated by the solid line in FIG. 2).

Recently, an oxide thin film transistor, as a promising semiconductor technology, has simpler manufacturing process and lower cost compared to a TFT made of p-si, and has higher mobility compared to a TFT made of a-si, therefore, it has drawn more and more attention, and is likely to be the mainstream backplane driving technique for various display panels, particularly for OLED (organic light-emitting diode) display panels and flexible display panels. However, the oxide TFT has characteristics of depletion-mode TFT, and when the depletion-mode oxide TFTs are applied directly in the shift register shown in FIG. 1, the shift register cannot operate normally (as indicated by the dotted line in FIG. 2). The reason why the shift register shown in FIG. 1 cannot operate normally due to the depletion mode-oxide TFTs will be explained below in conjunction with the drawings.

FIG. 3 illustrates a characteristic curve of an enhancement-mode TFT, and FIG. 4 illustrates a characteristic curve of a depletion-mode TFT. In FIGS. 3 and 4, vertical axis represents drain current $i_D$ of the TFT, and lateral axis represents gate-source voltage $v_{GS}$. It can be seen from FIG. 3 that the drain current $i_D$ is zero when the gate-source voltage $v_{GS}$ is zero, which indicates that the enhancement-mode TFT is completely cut off when the gate-source voltage is zero. It can also be seen from FIG. 4 that, the drain current $i_D$ is much greater than zero when the gate-source voltage $v_{GS}$ is zero, and the drain current $i_D$ is zero only when the gate-source voltage $v_{GS}$ is a certain negative voltage, which indicates that the depletion-mode TFT can be completely cut off only when the gate-source voltage $v_{GS}$ is a certain negative voltage.

If depletion-mode TFTs are adopted as the precharge transistor T100 and the reset transistor T200, when the shift register is in a pull-up stage, the first node PU1 may discharge through the precharge transistor T100 and the reset transistor T200, resulting in a voltage drop at the first node PU1, which makes the shift register unable to output normally (as indicated by the dotted line in FIG. 2), thus disabling the driving function of the gate driving circuit.

SUMMARY OF THE INVENTION

An object of the present invention is to provide a shift register, a gate driving circuit and a display device, which can effectively solve the leakage problem occurring in the shift register in which depletion mode TFTs are adopted.

To achieve the above object, the present invention provides a shift register, comprising:

a precharge and reset module, which is configured to precharge or reset a pull-up module according to a start signal input via a start signal input terminal or a reset signal input via a reset signal input terminal;

the pull-up module, which is configured to pull up a signal output by an output terminal of the shift register;

a first capacitor, which is configured to boost a voltage of a control terminal of the pull-up module in a pull-up stage;

a pull-down module, which is configured to pull down a signal output by the output terminal of the shift register; and a cut-off module, which is configured to disconnect electric connection between the precharge and reset module and the pull-up module in the pull-up stage, wherein the precharge and reset module is connected to a first power source and a second power source, the pull-up module is connected to a first clock signal terminal, a first terminal of the first capacitor is connected to the control terminal of the pull-up module, a second terminal of the first capacitor is connected to the output terminal of the shift register, the pull-down module is connected to a third power source, the cut-off module, the pull-up module and the pull-down module are connected at a first node, the pull-up module and the pull-down module are connected to the output terminal of the shift register, and the cut-off module is connected between the first node and the precharge and reset module.

Preferably, the second power source supplies a second power signal whose voltage is VGL, the third power source supplies a third power signal whose voltage is VGL1, and VGL1≤VGL.

Preferably, the cut-off module comprises: a ninth TFT, a tenth TFT, a third capacitor and a fourth power source, wherein a gate of the ninth TFT is connected to the fourth power source, a source of the ninth TFT is connected to the precharge and reset module, a drain of the ninth TFT is connected to a source of the tenth TFT;

a gate of the tenth TFT is connected to the fourth power source, the source of the tenth TFT is connected to a first terminal of the third capacitor, and a drain of the tenth TFT is connected to the first node; and a second terminal of the third capacitor is connected to the output terminal of the shift register.

Preferably, the first power source supplies a first power signal whose voltage is VGH, the fourth power source supplies a fourth power signal whose voltage is VGH1, and VGH1≥VGH.

Preferably, a first clock signal is input via the first clock signal terminal, a high-level voltage of the first clock signal is equal to the voltage of the fourth power signal supplied from the fourth power source, and a low-level voltage of the first clock signal is equal to the voltage of the third power signal supplied form the third power source.

Preferably, the cut-off module further comprises: a fourth capacitor, wherein a first terminal of the fourth capacitor is connected to the first terminal of the third capacitor and a second terminal of the fourth capacitor is connected to the third power source.

Preferably, the precharge and reset module comprises: a first TFT and a second TFT, wherein a gate of the first TFT is connected to the start signal input terminal, a source of the first TFT is connected to the first power source, and a drain of the first TFT is connected to the cut-off module; and a gate of the second TFT is connected to the reset signal input terminal, a source of the second TFT is connected to the second power source, and a drain of the second TFT is connected to the cut-off module.

Preferably, the pull-up module comprises: a third TFT and an eighth TFT, wherein a gate of the third TFT is connected to the first node, a source of the third TFT is connected to the first clock signal terminal, and a drain of the third TFT is connected to the output terminal of the shift register; and a gate of the eighth TFT is connected to the cut-off module, a source of the eighth TFT is connected to the first clock signal terminal, and a drain of the eighth TFT is connected to the output terminal of the shift register.

Preferably, the pull-down module comprises: a fourth TFT, a fifth TFT, a sixth TFT, a seventh TFT, a second capacitor and a fifth power source, wherein a gate of the fourth TFT is connected to a second clock signal terminal, a source of the fourth TFT is connected to the third power source, and a drain of the fourth TFT is connected to the output terminal of the shift register;

a gate of the fifth TFT is connected to the first node, a source of the fifth TFT is connected to the fifth power source, and a drain of the fifth TFT is connected to a second terminal of the second capacitor;

a gate of the sixth TFT is connected to the drain of the fifth TFT, a source of the sixth TFT is connected to the third power source, and a drain of the sixth TFT is connected to the output terminal of the shift register;

a gate of the seventh TFT is connected to the drain of the fifth TFT, a source of the seventh TFT is connected to the third power source, and a drain of the seventh TFT is connected to the first node;

a first terminal of the second capacitor is connected to the first clock signal terminal; and a second clock signal input via the second clock signal terminal is opposite to a first clock signal input via the first clock signal terminal in phase.

Preferably, the second power source supplies a second power signal whose voltage is VGL, the third power source supplies a third power signal whose voltage is VGL1, the fifth power source supplies a fifth power signal whose voltage is VGL2, and VGL2≤VGL1≤VGL.

To achieve the above object, the present invention further provides a gate driving circuit, comprising multiple stages of shift registers which are the above shift registers, wherein the output terminal of each of the shift registers is connected to the reset signal input terminal of a shift register in a previous stage and the start signal input terminal of a shift register in a next stage.

To achieve the above object, the present invention further provides a display device, comprising the above gate driving circuit.

The present invention can achieve the following beneficial effects:

In the shift register, the gate driving circuit and the display device provided by the present invention, the shift register is provided with the cut-off module, which is provided between the precharge and reset module and the pull-up module to disconnect the electric connection therebetween in the pull-up stage, and therefore, the first node cannot discharge through the precharge and reset module, which effectively avoids internal discharge of the shift register, further ensures normal output of the signal output from the output terminal of the shift register, and thus improves stability of the shift register.

DETAILED DESCRIPTION OF THE EMBODIMENTS

To make the person skilled in the art better understand the technical solutions of the present invention, a shift register, a gate driving circuit and a display device provided by the present invention will be described in detail below in conjunction with the accompanying drawings.

Figure 1:
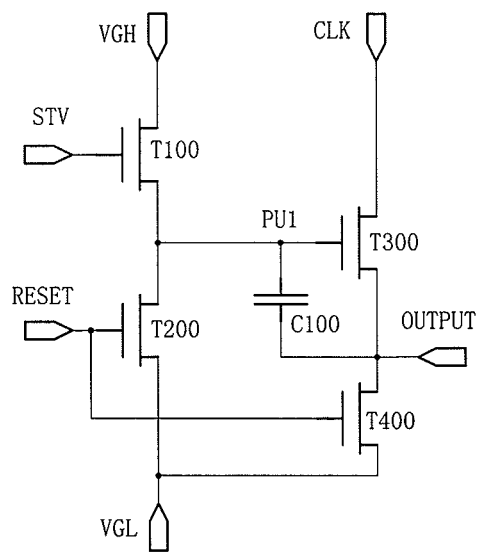
FIG. 1 is a circuit diagram of a shift register in the prior art.
Figure 2:
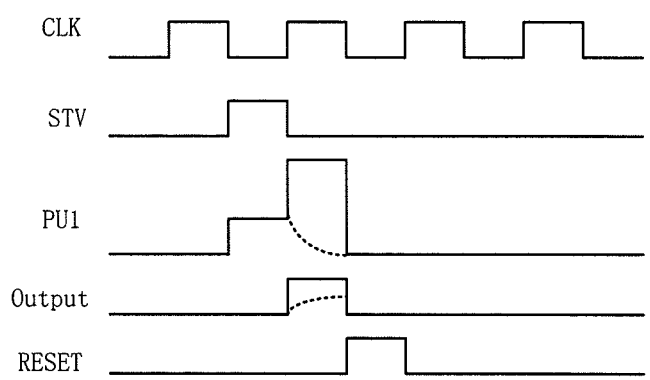
FIG. 2 is a timing diagram of signals of the shift register shown in FIG. 1.
Figure 3:
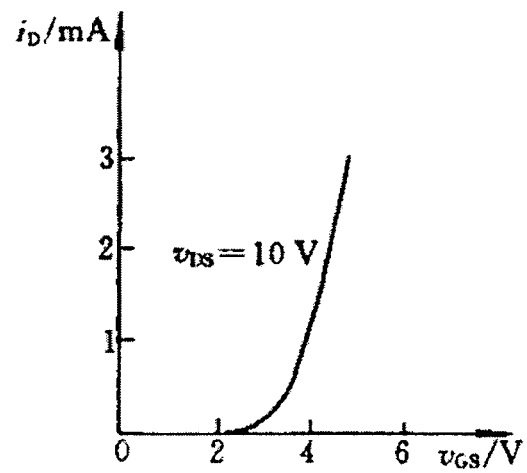
FIG. 3 is a diagram illustrating a characteristic curve of an enhancement-mode TFT.
Figure 4:
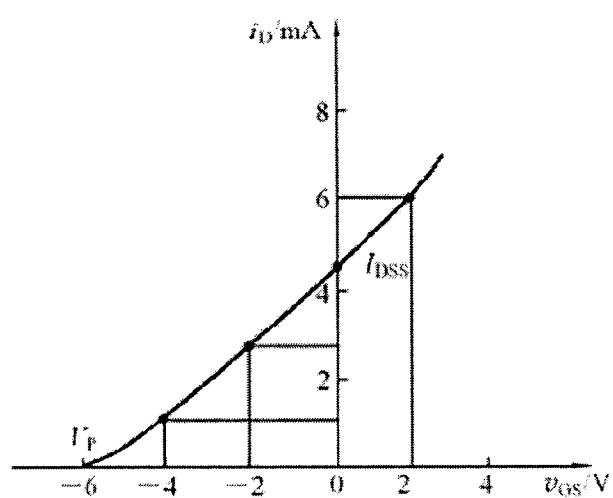
FIG. 4 is a diagram illustrating a characteristic curve of a depletion-mode TFT.
Figure 5:
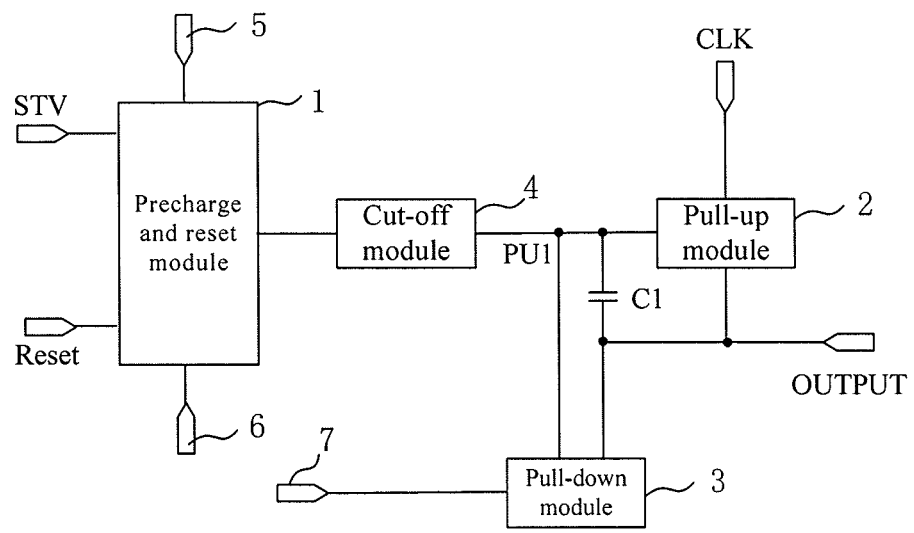
FIG. 5 is a schematic diagram of a shift register provided by an embodiment of the present invention.

FIG. 5 is a schematic diagram of a shift register provided by an embodiment of the present invention. As shown in FIG. 5, the shift register comprises: a precharge and reset module 1, a pull-up module 2, a first capacitor C1, a pull-down module 3 and a cut-off module 4, wherein the precharge and reset module 1 is connected to a first power source 5 and a second power source 6, the pull-up module 2 is connected to a first clock signal terminal, the pull-down module 3 is connected to a third power source 7, the cut-off module 4, the pull-up module 2 and the pull-down module 3 are connected at a first node PU1, a first terminal of the first capacitor C1 is connected to a control terminal of the pull-up module 2 (both the first terminal of the first capacitor C1 and the control terminal of the pull-up module 2 are connected to the first node PU1), a second terminal of the first capacitor C1 is connected to the output terminal OUTPUT of the shift register, and the cut-off module 4 is connected between the first node PU1 and the precharge and reset module 1, and both the pull-up module 2 and the pull-down module 3 are connected to the output terminal of the shift register. Here, the precharge and reset module 1 is configured to precharge or reset the pull-up module 2 according to a start signal STV input via a start signal input terminal or a reset signal RESET input via a reset signal input terminal; the pull-up module 2 is configured to pull up a signal output via an output terminal OUTPUT of the shift register; the first capacitor C1 is configured to boost a voltage of the control terminal of the pull-up module 2 in a pull-up stage; the pull-down module 3 is configured to pull down a signal output via the output terminal OUTPUT of the shift register; and the cut-off module 4 is configured to disconnect electric connection between the precharge and reset module 1 and the pull-up module 2 in the pull-up stage.

Here, the second power source 6 supplies a second power signal whose voltage is VGL, the third power source 7 supplies a third power signal whose voltage is VGL1, and VGL and VGL1 should satisfy the condition: VGL1≤VGL. In the embodiment, the third power source 7 is provided so that the voltage of the signal output from the output terminal OUTPUT of the shift register is smaller than or equal to VGL in a reset stage. As an optional solution, VGL1 may be equal to VGL, and at this point the second power source 6 and the third power source 7 may be the same one.

In the shift register provided by the embodiment, the cut-off module 4, which is used for disconnecting, in the pull-up stage, the electric connection between the precharge and reset module 1 and the pull-up module 2, is provided between the precharge and reset module 1 and the pull-up module 2. Therefore, no matter whether the TFTs in the precharge and reset module 1 are enhancement-mode TFTs or depletion-mode TFTs, when the shift register is in the pull-up stage, disconnecting the electric connection between the precharge and reset module 1 and the pull-up module 2 by the cut-off module 4 may make the first node PU1 unable to discharge through the precharge and reset module 1, which effectively avoids internal discharge of the shift register, further ensures normal output of the signal output from the output terminal OUTPUT of the shift register, and thus improves stability of the shift register.

Figure 6:
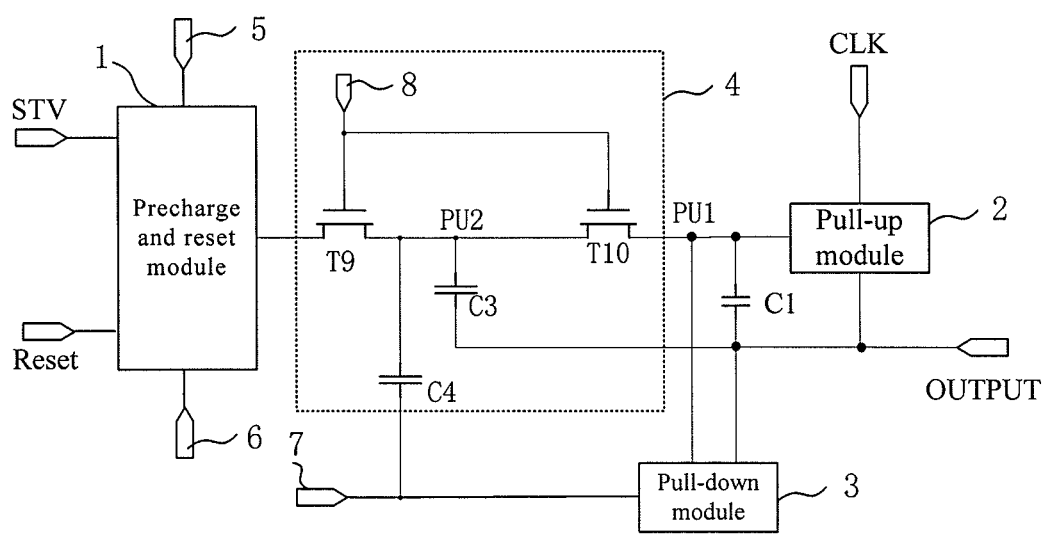
FIG. 6 is another schematic diagram of a shift register provided by the embodiment of the present invention.
Figure 7:
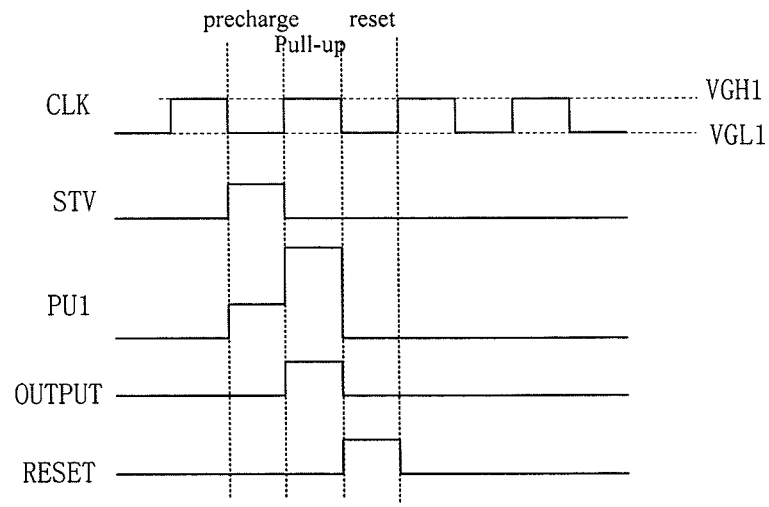
FIG. 7 is a timing diagram of signals of the shift register shown in FIG. 6.

FIG. 6 is another schematic diagram of the shift register provided by the embodiment of the present invention, in which a circuit diagram of the cut-off module 4 is illustrated, and FIG. 7 is a timing diagram of signals of the shift register shown in FIG. 6. As shown in FIGS. 6 and 7, the shift register comprises: a precharge and reset module 1, a pull-up module 2, a first capacitor C1, a pull-down module 3 and a cut-off module 4. Specifically, the cut-off module 4 comprises: a ninth TFT T9, a tenth TFT T10, a third capacitor C3 and a fourth power source 8, wherein a gate of the ninth TFT T9 is connected to the fourth power source 8, a source of the ninth TFT T9 is connected to the precharge and reset module 1, a drain of the ninth TFT T9 is connected to a source of the tenth TFT T10, a gate of the tenth TFT T10 is connected to the fourth power source 8, the source of the tenth TFT T10 is connected to a first terminal of the third capacitor C3 at the second node PU2, and a drain of the tenth TFT T10 is connected to the first node PU1; and a second terminal of the third capacitor C3 is connected to the output terminal OUTPUT of the shift register.

Here, the first power source 5 supplies a first power signal whose voltage is VGH, the fourth power source 8 supplies a fourth power signal whose voltage is VGH1, and VGH and VGH1 should satisfy the condition: VGH1≥VGH. Here, the voltage of the fourth power signal is set to be larger than that of the first power signal, so as to ensure that the ninth TFT T9 and the tenth TFT T10 are turned on normally in the precharge stage and the reset stage. A first clock signal CLK is input via the first clock signal terminal, a high-level voltage of the first clock signal CLK is equal to the voltage of the fourth power signal supplied from the fourth power source 8 (both are VGH1), and a low-level voltage of the first clock signal CLK is equal to the voltage of the third power signal supplied form the third power source 7 (both are VGL1).

The working process of the shift register provided by the present invention is described in detail below in conjunction with FIGS. 6 and 7.

When the shift register is in a precharge stage, the start signal STV is at a high level, the reset signal RESET is at a low level, the first clock signal CLK is at a low level whose voltage is VGL1, the fourth power source 8 supplies a voltage of VGH1, and then the output terminal OUTPUT of the shift register outputs a signal at a low level whose voltage is VGL1. At this point, the voltage at the gate of the ninth TFT T9 is VGH1, the voltage at the source of the ninth TFT T9 is VGH, accordingly the gate-source voltage of the ninth TFT T9 is VGH1–VGH, and therefore, the ninth TFT T9 is turned on. The on-state of the ninth TFT T9 makes the voltage at the source of the tenth TFT T10 become VGH, and meanwhile, the voltage at the gate of the tenth TFT T10 is VGH1, therefore, the gate-source voltage of the tenth TFT T10 is VGH1–VGH, and the tenth TFT T10 is thus turned on. Accordingly, the voltage at the first node PU1 is VGH, and the voltage at the second node PU2 is also VGH. Both the first capacitor C1 and the third capacitor C3 are charged, and the voltage differences between both terminals of the first capacitor C1 and between both terminals of the third capacitor C3 are both VGH–VGL1.

When the shift register is in a pull-up stage, the start signal STV is at a low level, the reset signal RESET is at a low level, the first clock signal CLK is at a high level whose voltage is VGH1, and then the output terminal OUTPUT of the shift register outputs a signal at a high level whose voltage is VGH1. At this point, both the voltage at the second terminal of the first capacitor C1 and the voltage at the second terminal of the third capacitor C3 (the second terminals of both capacitors are connected to the output terminal OUTPUT of the shift register) are changed, the voltage at the first node PU1 rises to VGH1+VGH−VGL1 due to the coupling of the first capacitor C1, and the voltage at the second node PU2 also rises to VGH1+VGH−VGL1 due to the coupling of the third capacitor C3. At this point, the voltage at the gate of the tenth TFT T10 is VGH1, the voltage at the source of the tenth TFT T10 is the same as that at the second node PU2, which is VGH1+VGH−VGL1, and therefore, the gate-source voltage of the tenth TFT T10 is VGL1−VGH. The values of the VGL1 and VGH may be set according to actual conditions, for example, the value of VGL1 may be set to be about −10V, the value of VGH may be set to be about 15V, the threshold voltage of the tenth TFT T10 is about −6V, and therefore, the gate-source voltage of the tenth TFT T10 is about −25V (=(−10V)−15V), which is much smaller than the threshold voltage of the tenth TFT T10. As a result, the tenth TFT T10 will be in a deeply cut-off state (be completely cut off), and thus the electric connection between the precharge and reset module 1 and the pull-up module 2 is disconnected reliably, which effectively prevents the voltage at the first node PU1 from being pulled down, solves the leaking problem of the oxide TFTs in the precharge and reset module 1, and ensures the normal output of the signal output from the output terminal OUTPUT of the shift register.

It should be noted that in the pull-up stage, the ninth TFT T9 will be in a cut-off state or in a slightly leaking state, thus effectively preventing the second node PU2 from discharging through the precharge and reset module 1, and effectively reducing leakage current.

When the shift register is in a reset stage, the start signal STV is at a low level, the reset signal RESET is at a high level, the first clock signal CLK is at a low level whose voltage is VGL1, and then the output terminal OUTPUT of the shift register outputs a signal at a low level whose voltage is VGL1. At this point, the voltages at both the first node PU1 and the second node PU2 are pulled down, and both the ninth TFT T9 and the tenth TFT T10 are turned on.

It should be noted that the specific structures of the precharge and reset module 1, the pull-up module 2 and the pull-down module 3 are not limited in the present invention, and may vary accordingly based on actual conditions.

In the embodiment, the cut-off module 4 may further comprise a fourth capacitor C4, a first terminal of which is connected to the first terminal of the third capacitor C3, and a second terminal of which is connected to the third power source 7. With the fourth capacitor C4, the voltage at the second node PU2 may be stabilized. In the pull-up stage, although the second node PU2 may charge the fourth capacitor C4 such that the voltage at the second node PU2 may be slightly smaller than VGH1+VGH−VGL1, the gate-source voltage of the tenth TFT T10 is still smaller than the threshold value of the tenth TFT T10, and therefore, the tenth TFT T10 is still in a deeply cut-off state.

The shift register provided by the embodiment is provided with the cut-off module 4 between the precharge and reset module 1 and the pull-up module 2, and the cut-off module is used for disconnecting, in the pull-up stage, the electric connection between the precharge and reset module 1 and the pull-up module 2, such that the first node PU1 cannot discharge through the precharge and reset module 1, which effectively avoids internal discharge of the shift register, further ensures normal output of the signal output from the output terminal OUTPUT of the shift register, and thus improves stability of the shift register.

Figure 8:
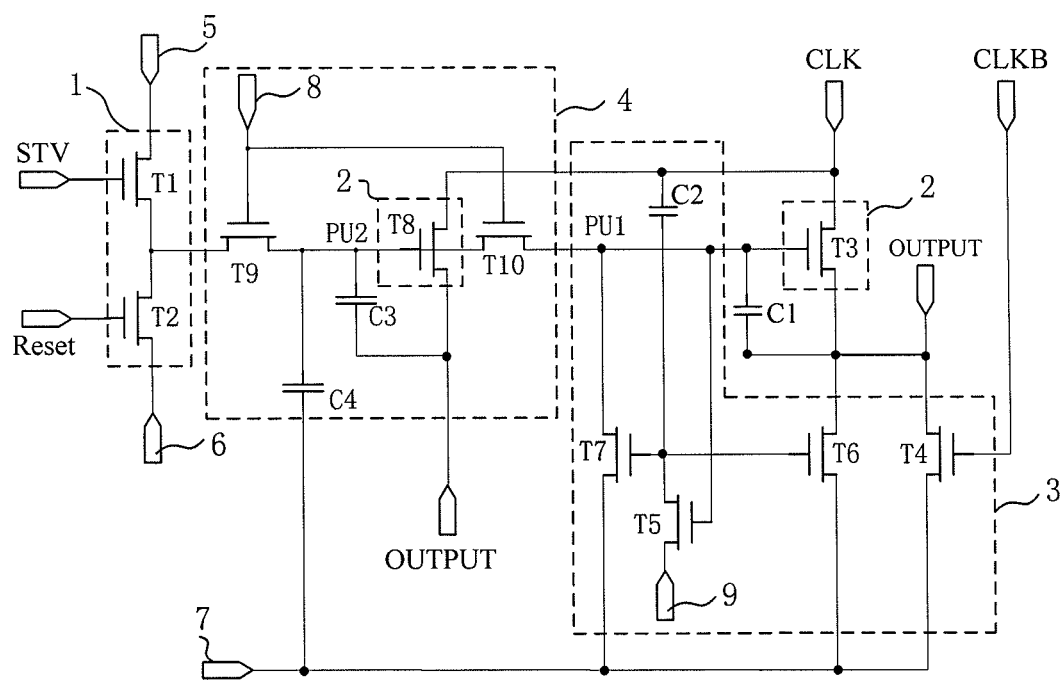
FIG. 8 is a circuit diagram of a shift register provided by an embodiment of the present invention.
Figure 9:
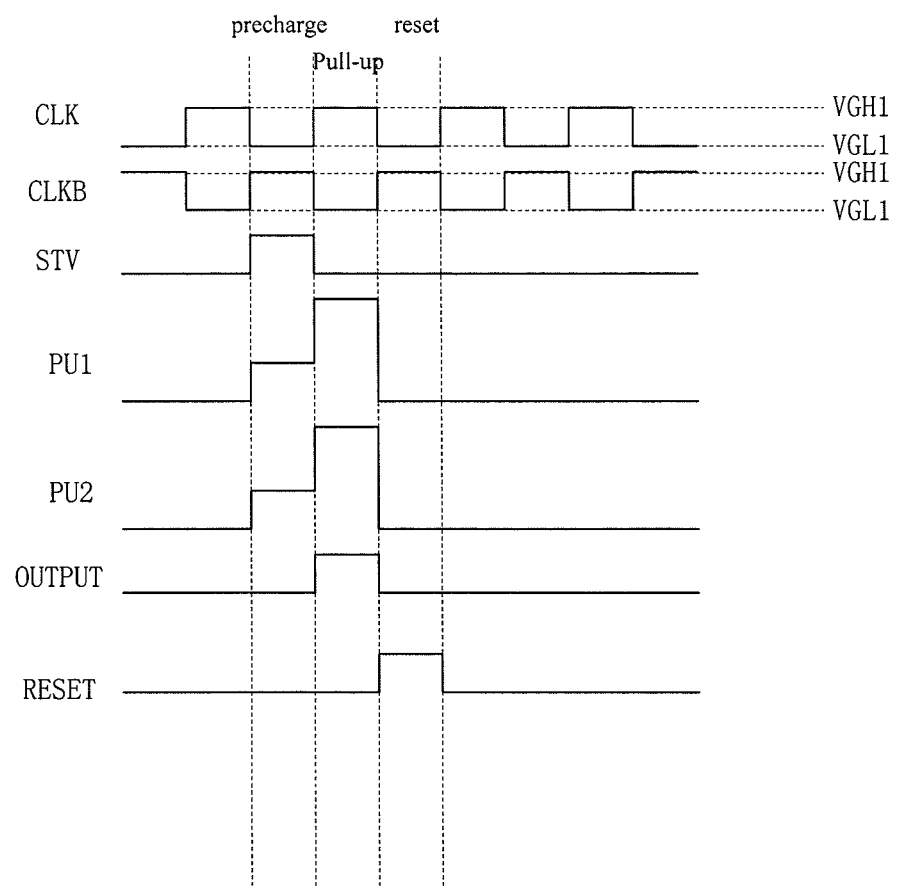
FIG. 9 is a timing diagram of signals of the shift register shown in FIG. 8.

FIG. 8 is a circuit diagram of a shift register provided by an embodiment of the present invention, and FIG. 9 is a timing diagram of signals of the shift register shown in FIG. 8. As shown in FIGS. 8 and 9, the shift register comprises: a precharge and reset module 1, a pull-up module 2, a first capacitor C1, a pull-down module 3 and a cut-off module 4. The specific structure of the cut-off module 4 is substantially the same as that of the cut-off module 4 shown in FIG. 6, and the description thereof may refer to the above description of FIG. 6.

The precharge and reset module 1 comprises: a first TFT T1 and a second TFT T2. Specifically, a gate of the first TFT T1 is connected to the start signal input terminal, a source of the first TFT T1 is connected to the first power source 5, and the drain of the first TFT T1 is connected to the cut-off module 4; a gate of the second TFT T2 is connected to the reset signal input terminal, a source of the second TFT T2 is connected to the second power source 6, and the drain of the second TFT T2 is connected to the cut-off module 4.

The pull-up module 2 comprises: a third TFT T3 and an eighth TFT T8. Specifically, a gate of the third TFT T3 is connected to the first node PU1, a source of the third TFT T3 is connected to the first clock signal terminal, and a drain of the third TFT T3 is connected to the output terminal OUTPUT of the shift register; and a gate of the eighth TFT T8 is connected to the cut-off module 4 (specifically, is connected to the second node PU2), a source of the eighth TFT T8 is connected to the first clock signal terminal, and a drain of the eighth TFT T8 is connected to the output terminal OUTPUT of the shift register.

The pull-down module 3 comprises: a fourth TFT T4, a fifth TFT T5, a sixth TFT T6, a seventh TFT T7, a second capacitor C2 and a fifth power source 9. Specifically, a gate of the fourth TFT T4 is connected to a second clock signal terminal, a source of the fourth TFT T4 is connected to the third power source 7, and a drain of the fourth TFT T4 is connected to the output terminal OUTPUT of the shift register; a gate of the fifth TFT T5 is connected to the first node PU1, a source of the fifth TFT T5 is connected to the fifth power source 9, and a drain of the fifth TFT T5 is connected to a second terminal of the second capacitor C2; a gate of the sixth TFT T6 is connected to the drain of the fifth TFT T5, a source of the sixth TFT T6 is connected to the third power source 7, and a drain of the sixth TFT T6 is connected to the output terminal OUTPUT of the shift register; a gate of the seventh TFT T7 is connected to the drain of the fifth TFT T5, a source of the seventh TFT T7 is connected to the third power source 7, and a drain of the seventh TFT T7 is connected to the first node PU1; a first terminal of the second capacitor C2 is connected to the first clock signal terminal; and a second clock signal CLKB input via the second clock signal terminal is opposite to a first clock signal CLK input via the first clock signal terminal in phase, that is, a phase difference between the second clock signal CLKB and the first clock signal CLK is 180 degrees. Here, the fifth power source 9 supplies a fifth power signal.

In this embodiment, a voltage of the first power signal is VGH, a voltage of the second power signal is VGL, a voltage of the third power signal is VGL1, a voltage of the fourth power signal is VGH1, a voltage of the fifth power signal is VGL2, a low-level voltage of the first clock signal CLK is VGL1, a high-level voltage of the first clock signal CLK is VGH1, a low-level voltage of the second clock signal CLKB is VGL1, a high-level voltage of the second clock signal CLKB is VGH1, VGH and VGH1 satisfy the condition: VGH1≥VGH, and VGL, VGL1 and VGL2 satisfy the condition: VGL2≤VGL1≤VGL. As an optional solution of the embodiment, VGH=VGH1=15V, VGL=VGL1=−10V, and VGL2=−12V.

Figure 10:
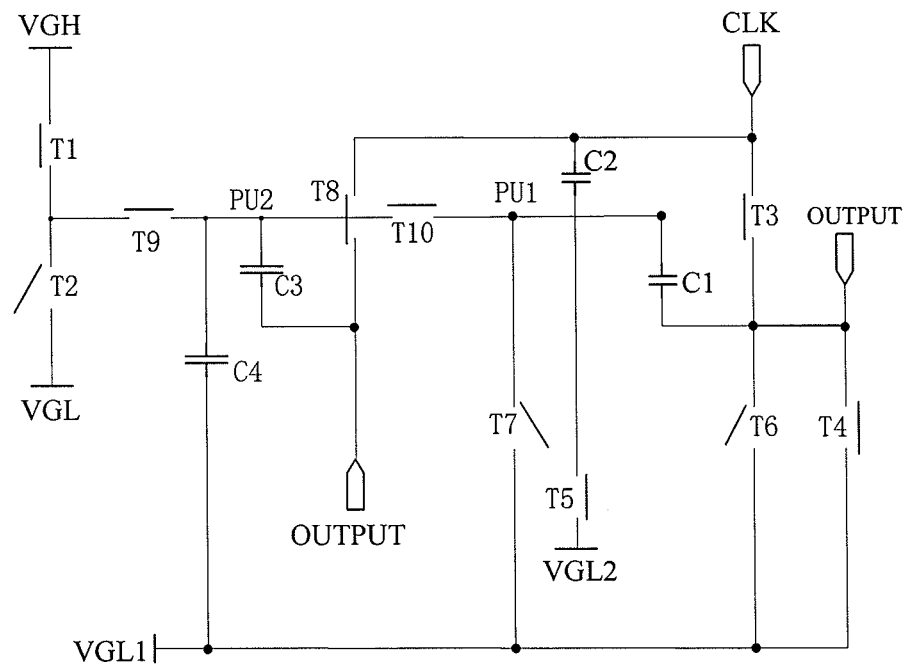
FIG. 10 is an equivalent circuit diagram of the shift register shown in FIG. 8 in a precharge stage.
Figure 11:
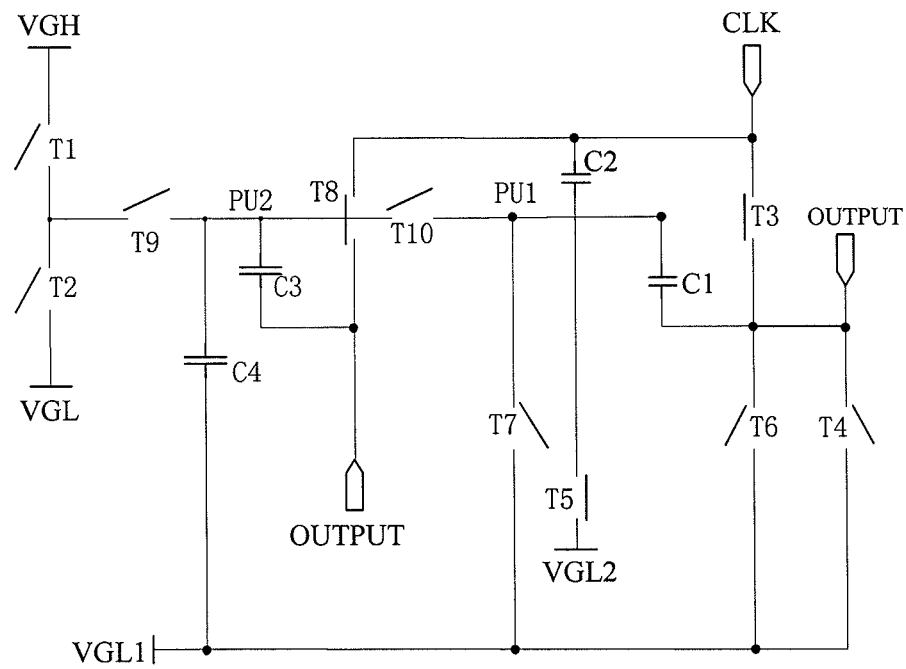
FIG. 11 is an equivalent circuit diagram of the shift register shown in FIG. 8 in a pull-up stage.
Figure 12:
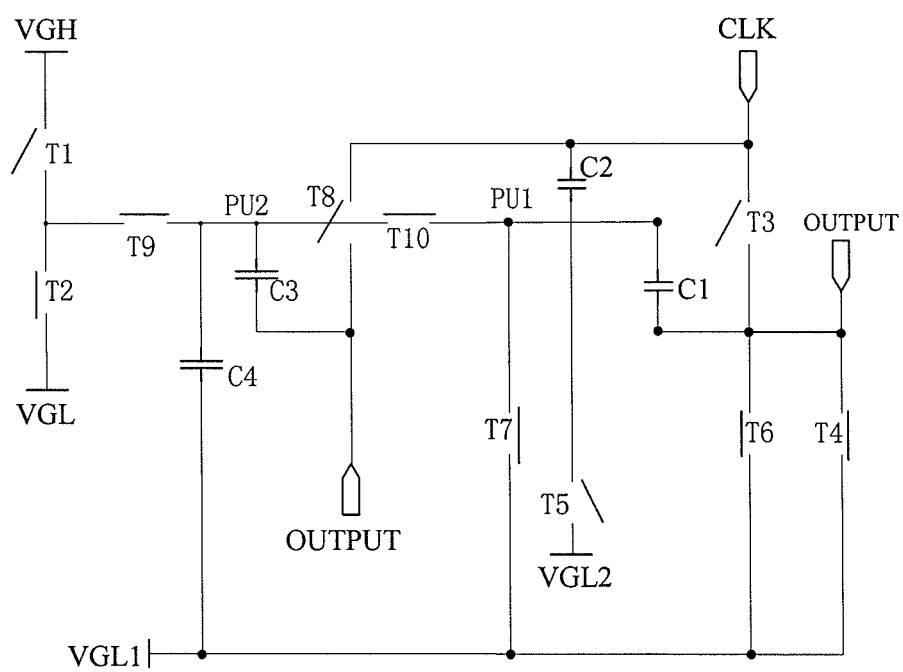
FIG. 12 is an equivalent circuit diagram of the shift register shown in FIG. 8 in a reset stage.

The working process of the shift register provided by the embodiment is described in detail below in conjunction with the FIGS. 9 to 11. Specifically, FIG. 10 is an equivalent circuit diagram of the shift register shown in FIG. 8 in a precharge stage; FIG. 11 is an equivalent circuit diagram of the shift register shown in FIG. 8 in a pull-up stage; FIG. 12 is an equivalent circuit diagram of the shift register shown in FIG. 8 in a reset stage. It should be noted that both the first TFT T1 and the second TFT T2 in the embodiment are p-type TFTs.

Referring to FIGS. 9 and 10, when the shift register is in a precharge stage, the start signal STV is at a high level, the reset signal RESET is at a low level, the first clock signal CLK is at a low level whose voltage is VGL1, the second clock signal CLKB is at a high level whose voltage is VGH1, and then the output terminal OUTPUT of the shift register outputs a signal at a low level whose voltage is VGL1. At this point, the first TFT T1, the third TFT T3, the fourth TFT T4, the fifth TFT T5, the eighth TFT T8, the ninth TFT T9 and the tenth TFT T10 are in a turned-on state, and the second TFT T2, the sixth TFT T6 and the seventh TFT T7 are in a cut-off state; the voltage at the first node PU1 is VGH, the voltage at the second node PU2 is also VGH, both the first capacitor C1 and the third capacitor C3 are charged, and the voltage differences between both terminals of the first capacitor C1 and between both terminals of the third capacitor C3 are both VGH–VGL1.

Referring to FIGS. 9 and 11, when the shift register is in the pull-up stage, the start signal STV is at a low level, the reset signal RESET is at a low level, the first clock signal CLK is at a high level whose voltage is VGH1, the second clock signal CLKB is at a low level whose voltage is VGL1, and then the output terminal OUTPUT of the shift register outputs a signal at a high level whose voltage is VGH1. At this point, the third TFT T3, the fifth TFT T5 and the eighth TFT T8 are in a turned-on state, the first TFT T1, the second TFT T2, the fourth TFT T4, the sixth TFT T6, the seventh TFT T7, the ninth TFT T9 and the tenth TFT T10 are in a cut-off state. At this time, both the voltage at the second terminal (connected to the output terminal OUTPUT of the shift register) of the first capacitor C1 and the voltage at the second terminal (connected to the output terminal OUTPUT of the shift register) of the third capacitor C3 are changed, the voltage at the first node PU1 rises to VGH1+VGH–VGL1 due to the coupling of the first capacitor C1, and the voltage at the second node PU2 also rises to VGH1+VGH–VGL1 due to the coupling of the third capacitor C3. At this point, the voltage at the gate of the tenth TFT T10 is VGH1, the voltage at the source of the tenth TFT T10 is the same as that at the second node PU2, which is VGH1+VGH–VGL1, and therefore, the gate-source voltage of the tenth TFT T10 is VGL1–VGH. The values of the VGL1 and VGH may be set according to actual conditions. In this embodiment, VGL1=–10V, VGH=15V, the threshold voltage of the tenth TFT T10 is about –6V, and therefore, the gate-source voltage of the tenth TFT T10 is about –25V (=(–10V)–15V), which is smaller than the threshold voltage of the tenth TFT T10. As a result, the tenth TFT T10 will be in a deep cut-off state (be completely cut off), and thus the electric connection between the precharge and reset module 1 and the pull-up module 2 is disconnected reliably, which effectively prevents the voltage at the first node PU1 from being pulled down, solves the leaking problem of the oxide TFTs (T1 and T2) in the precharge and reset module 1, and ensures the normal output of the signal output from the output terminal OUTPUT of the shift register.

It should be noted that, in the pull-up stage, both the gate-source voltage of the sixth TFT T6 and the gate-source voltage of the seventh TFT T7 are VGL2–VGL1, and in this embodiment, VGL, VGL1 and VGL2 satisfy the condition: VGL2≤VGL1≤VGL, which may cause the sixth TFT T6 and the seventh TFT T7 to be in a deep cut-off state in the pull-up state, and thus the first node PU1 may be prevented from discharging through the seventh TFT T7, the phenomenon of internal leakage of the shift register is reduced and output of the output terminal OUTPUT of the shift register may be protected from being influenced. Specifically, the first node PU1 may discharge through the seventh TFT T7, and the sixth TFT T6 may control the discharge of the output terminal OUTPUT of the shift register. Therefore, in the pull-up stage, both the sixth TFT T6 and the seventh TFT T7 need to be in a cut-off state, and thus the output of the output terminal OUTPUT of the shift register and the electric potential of the first node PU1 may not be influenced (the electric potential of the first node PU1 may influence the output of the output terminal OUTPUT of the shift register).

Referring to FIGS. 9 and 12, when the shift register is in a reset stage, the start signal STV is at a low level, the reset signal RESET is at a high level, the first clock signal CLK is at a low level whose voltage is VGL1, the second clock signal CLKB is at a high level whose voltage is VGH1, and then the output terminal OUTPUT of the shift register outputs a signal at a low level whose voltage is VGL1. At this point, the second TFT T2, the fourth TFT T4, the sixth TFT T6, the seventh TFT T7, the ninth TFT T9 and the tenth TFT T10 are in a turned-on state, and the first TFT T1, the third TFT T3, the fifth TFT T5 and the eighth TFT T8 are in a cut-off state. The voltages at both the first node PU1 and the second node PU2 are pulled down.

It should be noted that in this embodiment, the specific structures of the precharge and reset module 1, the pull-up module 2 and the pull-down module 3 are merely exemplary, rather than limiting the technical solution of the present invention. In addition, although the first to tenth TFTs T1 to T10 in the embodiment are P-type TFTs, the first to tenth TFTs T1 to T10 may also be N-type TFTs, and the same effect can also be achieved by adjusting levels of respective control signals correspondingly.

The shift register provided by the embodiment is provided with the cut-off module 4 between the precharge and reset module 1 and the pull-up module 2, and the cut-off module is used for disconnecting, in the pull-up stage, the electric connection between the precharge and reset module 1 and the pull-up module 2, such that the first node PU1 cannot discharge through the precharge and reset module 1, which effectively avoids internal discharge of the shift register, further ensures normal output of the signal output from the output terminal OUTPUT of the shift register, and thus improves stability of the shift register.

An embodiment of the present invention provides a gate driving circuit.

Figure 13:
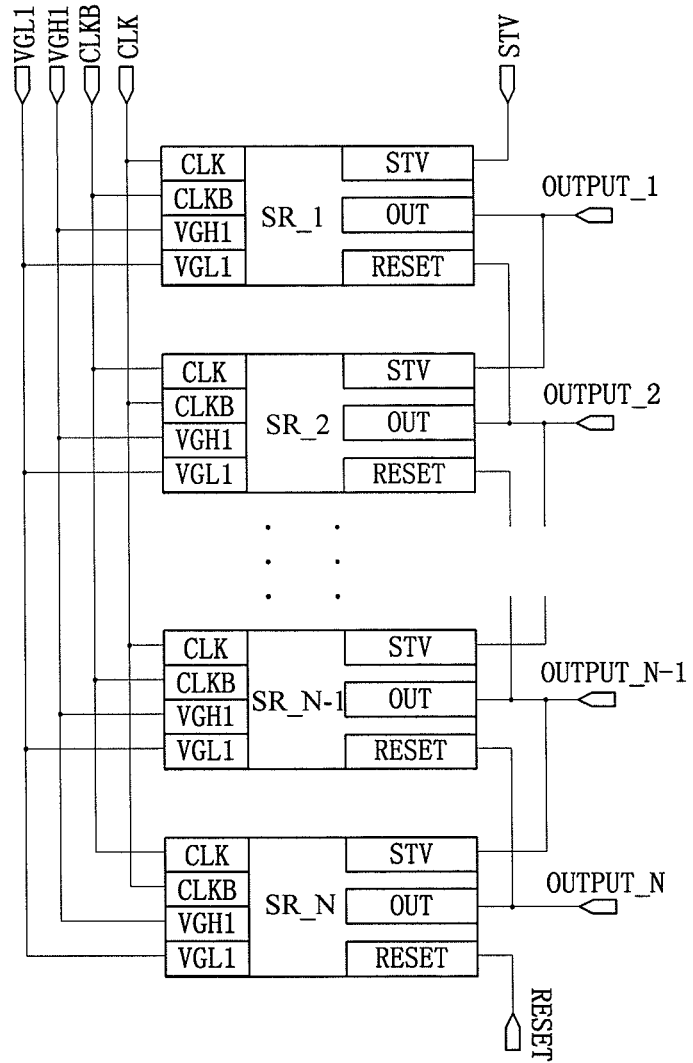
FIG. 13 is a schematic diagram illustrating a circuit structure of a gate driving circuit provided by an embodiment of the present invention.

FIG. 13 is a schematic diagram illustrating a circuit structure of a gate driving circuit provided by an embodiment of the present invention. As shown in FIG. 13, the gate driving circuit comprises multiple stages of shift registers which are the shift registers provided by the above embodiments. Specifically, the output terminal OUTPUT of a shift register SR in each stage outputs a line scanning signal (e.g. OUTPUT_1) of the present stage, and each shift register has one first clock signal input terminal via which the first clock signal CLK is input and one second clock signal input terminal via which the second clock signal CLKB is input; the phase difference between the first clock signal CLK and the second clock signal CLKB is 180 degrees, the first clock signal CLK and the second clock signal are at a high level in half the time of their respective work cycles, and at a low level in the other half the time of their respective work cycles, in addition, the first clock signals CLK of two adjacent shift registers have a phase difference of 180 degrees therebetween, and meanwhile, the second clock signals CLK of two adjacent shift registers also have a phase difference of 180 degrees therebetween. Except a shift register SR_1 in the first stage, for each of the other shift registers, the output terminal of the shift register is connected to the reset signal input terminal of a shift register in an immediately-previous stage; except a shift register SR-N in the last stage, for each of the other shift registers, the output terminal of the shift register is connected to the start signal input terminal of a shift register in an immediately-following stage.

The shift register in the gate driving circuit provided by the embodiment is provided with the cut-off module 4 between the precharge and reset module 1 and the pull-up module 2, and the cut-off module is used for disconnecting, in the pull-up stage, the electric connection between the precharge and reset module 1 and the pull-up module 2, such that the first node PU1 cannot discharge through the precharge and reset module 1, which effectively avoids internal discharge of the shift register, further ensures normal output of the signal output from the output terminal OUTPUT of the shift register, improves stability of the shift register, and thus enables the gate driving circuit to output a scanning signal stably.

An embodiment of the present invention provides a display device comprising a gate driving circuit, in which the shift registers provided by the above embodiments are adopted, detailed description thereof may refer to the above description of the gate driving circuit, and is not repeated here.

The display device provided by the embodiment comprises a gate driving circuit comprising multiple stages of shift registers, the shift register is provided with the cut-off module 4, which is used for disconnecting, in the pull-up stage, the electric connection between the precharge and reset module 1 and the pull-up module 2, which avoids internal discharge of the shift register in the pull-up stage, improves stability of the shift register, enables the gate driving circuit to output a scanning signal stably, and effectively improves the performance of the display device.

It should be understood that, the above implementations are merely exemplary implementations used for explaining the principle of the present invention, but the present invention is not limited thereto. For those skilled in the art, various variations and improvements could be made without departing from the spirit and essence of the present invention, and these variations and improvements are also be deemed as the protection scope of the present invention.

The invention claimed is:

1. A shift register, comprising:
a precharge and reset module, configured to precharge or reset a pull-up module according to a start signal input via a start signal input terminal or a reset signal input via a reset signal input terminal;
the pull-up module, configured to pull up a signal output by an output terminal of the shift register;
a first capacitor, configured to boost a voltage of a control terminal of the pull-up module in a pull-up stage;
a pull-down module, configured to pull down a signal output by the output terminal of the shift register; and
a cut-off module, configured to disconnect electric connection between the precharge and reset module and the pull-up module in the pull-up stage,
wherein the precharge and reset module is connected to a first power source and a second power source, the pull-up module is connected to a first clock signal terminal, a first terminal of the first capacitor is connected to the control terminal of the pull-up module, a second terminal of the first capacitor is connected to the output terminal of the shift register, the pull-down module is connected to a third power source, the cut-off module, the pull-up module and the pull-down module are connected at a first node, the pull-up module and the pull-down module are connected to the output terminal of the shift register, the cut-off module is connected between the first node and the precharge and reset module, and the pull-up module and cut-off module are also connected at a second node; and
wherein the cut-off module comprises: a ninth TFT, a tenth TFT, a third capacitor and a fourth power source,
a gate of the ninth TFT is connected to the fourth power source, a source of the ninth TFT is connected to the precharge and reset module, a drain of the ninth TFT and a source of the tenth TFT are connected at the second node;
a gate of the tenth TFT is connected to the fourth power source, the source of the tenth TFT is connected to a first terminal of the third capacitor, and a drain of the tenth TFT is connected to the first node; and
a second terminal of the third capacitor is connected to the output terminal of the shift register.

2. The shift register according to claim 1, wherein the second power source supplies a second power signal whose voltage is VGL, the third power source supplies a third power signal whose voltage is VGL1, and VGL1≤VGL.

3. The shift register according to claim 1, wherein, the first power source supplies a first power signal whose voltage is VGH, the fourth power source supplies a fourth power signal whose voltage is VGH1, and VGH1≥VGH.

4. The shift register according to claim 3, wherein, the cut-off module further comprises: a fourth capacitor,
a first terminal of the fourth capacitor is connected to the first terminal of the third capacitor and a second terminal of the fourth capacitor is connected to the third power source.

5. The shift register according to claim 1, wherein, a first clock signal is input via the first clock signal terminal, a high-level voltage of the first clock signal is equal to the voltage of the fourth power signal supplied from the fourth power source, and a low-level voltage of the first clock signal is equal to the voltage of the third power signal supplied form the third power source.

6. The shift register according to claim 5, wherein, the cut-off module further comprises: a fourth capacitor,
a first terminal of the fourth capacitor is connected to the first terminal of the third capacitor and a second terminal of the fourth capacitor is connected to the third power source.

7. The shift register according to claim 6, wherein, the precharge and reset module comprises: a first TFT and a second TFT,
a gate of the first TFT is connected to the start signal input terminal, a source of the first TFT is connected to the first power source, and the drain of the first TFT is connected to the cut-off module; and
a gate of the second TFT is connected to the reset signal input terminal, a source of the second TFT is connected to the second power source, and the drain of the second TFT is connected to the cut-off module.

8. The shift register according to claim 7, wherein, the pull-up module comprises: a third TFT and an eighth TFT,
a gate of the third TFT is connected to the first node, a source of the third TFT is connected to the first clock signal terminal, and a drain of the third TFT is connected to the output terminal of the shift register; and
a gate of the eighth TFT is connected to the cut-off module, a source of the eighth TFT is connected to the first clock signal terminal, and a drain of the eighth TFT is connected to the output terminal of the shift register.

9. The shift register according to claim 8, wherein, the pull-down module comprises: a fourth TFT, a fifth TFT, a sixth TFT, a seventh TFT, a second capacitor and a fifth power source,
a gate of the fourth TFT is connected to a second clock signal terminal, a source of the fourth TFT is connected to the third power source, and a drain of the fourth TFT is connected to the output terminal of the shift register;

a gate of the fifth TFT is connected to the first node, a source of the fifth TFT is connected to the fifth power source, and a drain of the fifth TFT is connected to a second terminal of the second capacitor;

a gate of the sixth TFT is connected to the drain of the fifth TFT, a source of the sixth TFT is connected to the third power source, and a drain of the sixth TFT is connected to the output terminal of the shift register;

a gate of the seventh TFT is connected to the drain of the fifth TFT, a source of the seventh TFT is connected to the third power source, and a drain of the seventh TFT is connected to the first node;

a first terminal of the second capacitor is connected to the first clock signal terminal; and a second clock signal input via the second clock signal terminal is opposite to a first clock signal input via the first clock signal terminal in phase.

10. The shift register according to claim 9, wherein, the second power source supplies a second power signal whose voltage is VGL, the third power source supplies the third power signal whose voltage is VGL1, the fifth power source supplies a fifth power signal whose voltage is VGL2, and VGL2≤VGL1≤VGL.

11. The shift register according to claim 1, wherein the cut-off module further comprises: a fourth capacitor, a first terminal of the fourth capacitor is connected to the first terminal of the third capacitor and a second terminal of the fourth capacitor is connected to the third power source.

12. The shift register according to claim 1, wherein, the precharge and reset module comprises: a first TFT and a second TFT, a gate of the first TFT is connected to the start signal input terminal, a source of the first TFT is connected to the first power source, and a drain of the first TFT is connected to the cut-off module; and a gate of the second TFT is connected to the reset signal input terminal, a source of the second TFT is connected to the second power source, and a drain of the second TFT is connected to the cut-off module.

13. The shift register according to claim 1, wherein, the pull-up module comprises: a third TFT and an eighth TFT, a gate of the third TFT is connected to the first node, a source of the third TFT is connected to the first clock signal terminal, and a drain of the third TFT is connected to the output terminal of the shift register; and a gate of the eighth TFT is connected to the second node, a source of the eighth TFT is connected to the first clock signal terminal, and a drain of the eighth TFT is connected to the output terminal of the shift register.

14. The shift register according to claim 1, wherein, the pull-down module comprises: a fourth TFT, a fifth TFT, a sixth TFT, a seventh TFT, a second capacitor and a fifth power source, a gate of the fourth TFT is connected to a second clock signal terminal, a source of the fourth TFT is connected to the third power source, and a drain of the fourth TFT is connected to the output terminal of the shift register;

a gate of the fifth TFT is connected to the first node, a source of the fifth TFT is connected to the fifth power source, and a drain of the fifth TFT is connected to a second terminal of the second capacitor;

a gate of the sixth TFT is connected to the drain of the fifth TFT, a source of the sixth TFT is connected to the third power source, and a drain of the sixth TFT is connected to the output terminal of the shift register;

a gate of the seventh TFT is connected to the drain of the fifth TFT, a source of the seventh TFT is connected to the third power source, and a drain of the seventh TFT is connected to the first node;

a first terminal of the second capacitor is connected to the first clock signal terminal; and a second clock signal input via the second clock signal terminal is opposite to a first clock signal input via the first clock signal terminal in phase.

15. The shift register according to claim 14, wherein, the second power source supplies a second power signal whose voltage is VGL, the third power source supplies a third power signal whose voltage is VGL1, the fifth power source supplies a fifth power signal whose voltage is VGL2, and VGL2≤VGL1≤VGL.

16. A gate driving circuit, comprising multiple stages of shift registers, each of which is the shift register according to claim 1, wherein the output terminal of each of the shift registers is connected to the reset signal input terminal of a shift register in a previous stage and the start signal input terminal of a shift register in a next stage.

17. The gate driving circuit according to claim 16, wherein the second power source supplies a second power signal whose voltage is VGL, the third power source supplies a third power signal whose voltage is VGL1, and VGL1≤VGL.

18. The gate driving circuit according to claim 16, wherein the second terminal of the third capacitor is also connected to the output terminal of the shift register, the start signal input terminal of a previous stage shift register, or the start signal input terminal of a next stage shift register.

19. A display device, comprising the gate driving circuit according to claim 16.

* * * * *